United States Patent
Shimakura et al.

(10) Patent No.: US 8,766,185 B2
(45) Date of Patent: Jul. 1, 2014

(54) CHARGED PARTICLE BEAM DEVICE

(75) Inventors: Tomokazu Shimakura, Kawasaki (JP); Masaki Hasegawa, Sayama (JP)

(73) Assignee: Hitachi, Ltd., Tokyo (JP)

( * ) Notice: Subject to any disclaimer, the term of this patent is extended or adjusted under 35 U.S.C. 154(b) by 84 days.

(21) Appl. No.: 12/688,095

(22) Filed: Jan. 15, 2010

(65) Prior Publication Data
US 2010/0181480 A1 Jul. 22, 2010

(30) Foreign Application Priority Data
Jan. 20, 2009 (JP) .................... 2009-009798

(51) Int. Cl.
G01N 23/225 (2006.01)
H01J 37/02 (2006.01)
H01J 37/20 (2006.01)
H01J 37/28 (2006.01)

(52) U.S. Cl.
CPC ............... H01J 37/026 (2013.01); H01J 37/20 (2013.01); H01J 37/28 (2013.01)
USPC ............................ 250/311; 250/306; 250/307

(58) Field of Classification Search
CPC .......... H01J 37/026; H01J 37/20; H01J 37/28
USPC ................................................. 250/306–311
See application file for complete search history.

(56) References Cited

U.S. PATENT DOCUMENTS

| | | | | |
|---|---|---|---|---|
| 4,237,445 A * | 12/1980 | Crossman | ...................... | 340/448 |
| 6,903,338 B2 * | 6/2005 | Mankos et al. | .................... | 850/9 |
| 7,135,676 B2 * | 11/2006 | Nakasuji et al. | ............... | 250/310 |
| 7,317,606 B2 * | 1/2008 | Petrov et al. | ................... | 361/234 |
| 8,232,522 B2 * | 7/2012 | Miya et al. | ..................... | 250/306 |
| 8,294,094 B1 * | 10/2012 | Zhao et al. | ..................... | 250/306 |
| 2004/0040663 A1 * | 3/2004 | Udo et al. | ................. | 156/345.51 |
| 2004/0149906 A1 * | 8/2004 | Mankos et al. | ............... | 250/310 |
| 2006/0060781 A1 * | 3/2006 | Watanabe et al. | ............. | 250/310 |
| 2006/0126261 A1 * | 6/2006 | Petrov et al. | ................... | 361/234 |
| 2006/0169900 A1 * | 8/2006 | Noji et al. | ...................... | 250/310 |
| 2006/0249676 A1 * | 11/2006 | Shinada et al. | ............... | 250/310 |
| 2007/0057183 A1 * | 3/2007 | Arai et al. | ...................... | 250/310 |
| 2007/0215279 A1 * | 9/2007 | Koshiishi | ................... | 156/345.3 |
| 2007/0272857 A1 * | 11/2007 | Hasegawa et al. | ............. | 250/307 |
| 2008/0315093 A1 * | 12/2008 | Hasegawa et al. | ............. | 250/310 |
| 2009/0101816 A1 * | 4/2009 | Noji et al. | ...................... | 250/310 |

(Continued)

FOREIGN PATENT DOCUMENTS

| | | |
|---|---|---|
| JP | 11-108864 A | 4/1999 |
| JP | 2000-149845 A | 5/2000 |

(Continued)

*Primary Examiner* — Michael Logie
*Assistant Examiner* — Wyatt Stoffa
(74) *Attorney, Agent, or Firm* — Mattingly & Malur, PC

(57) ABSTRACT

The charged particle beam device has an unlimitedly rotatable sample stage and an electric field control electrode for correcting electric field distortion at a sample peripheral part. A voltage is applied to a sample on the unlimitedly rotatable sample stage through a retarding electrode that is in contact with a holder receiver at a rotation center of a rotary stage. An equipotential plane on the electric field control electrode is varied by applying a voltage to the electric field control electrode, and following this the equipotential plane at a sample edge is corrected, which enables the sample to be observed as far as its edge.

15 Claims, 15 Drawing Sheets

(56) References Cited

U.S. PATENT DOCUMENTS

| | | | |
|---|---|---|---|
| 2009/0261252 A1* | 10/2009 | Hasegawa et al. | 250/311 |
| 2010/0181480 A1* | 7/2010 | Shimakura et al. | 250/310 |
| 2010/0304572 A1* | 12/2010 | Koshimizu | 438/710 |
| 2011/0068267 A1* | 3/2011 | Hasegawa et al. | 250/310 |
| 2011/0095185 A1* | 4/2011 | Miya et al. | 250/311 |
| 2011/0272100 A1* | 11/2011 | Koshiishi | 156/345.43 |

FOREIGN PATENT DOCUMENTS

| | | | |
|---|---|---|---|
| JP | 2004-14251 A | | 1/2004 |
| JP | 2004-235149 A | | 8/2004 |
| JP | 2007255967 A | * | 10/2007 |

* cited by examiner

F I G . 2
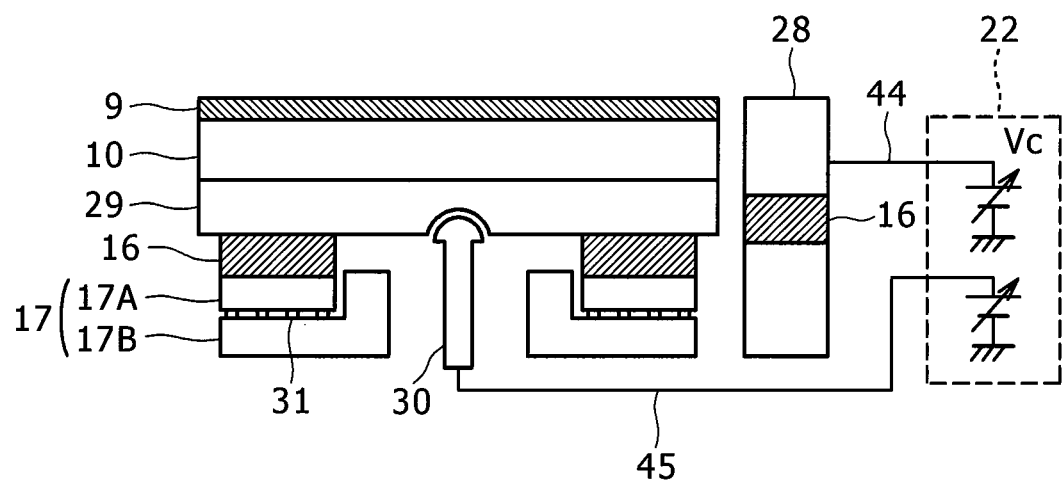

CHARGED PARTICLE BEAM DEVICE

CLAIM OF PRIORITY

The present application claims priority from Japanese Patent Application JP 2009-009798 filed on Jan. 20, 2009, the content of which is hereby incorporated by reference into this application.

FIELD OF THE INVENTION

The present invention relates to a charged particle beam device, and more specifically to a charged particle beam device suitable for observation and inspection of a semiconductor wafer, a magnetic recording medium used in a hard disk drive, etc.

BACKGROUND OF THE INVENTION

As devices for inspecting a foreign substance on a semiconductor wafer, a defect of a circuit pattern thereof, etc., devices using electron beams are being used. In these electron beam inspection devices, a scanning electron microscope in which an electron beam is focused in the shape of a point and is scanned has become mainstream. In order that the electron beam inspection device perform inspection with desired resolution and sensitivity while suppressing damages to an observed sample, the irradiation energy of the electron beam is controlled by applying a voltage to the semiconductor wafer. Application of this voltage is called retarding. Although an electric field arises above the sample by the retarding, this electric field is not uniform near a sample edge and is distorted. As a result, a trajectory of the electron beam is bent irregularly, and consequently beam shift, shading, etc. occur; therefore, it is difficult to observe a correct image at the sample edge. Any device that uses the retarding with the use of the charged particle beam has a possibility that an effect caused by such disturbance of the electric field may occur.

An inspection device called a projection type inspection device is known from Japanese Unexamined Patent Application Publication No. H11 (1999)-108864, etc. as a kind of observation technique whereby a retarding voltage is applied to the sample and observation is performed using the electron beam. This technique is one that irradiates the electron beam as an "area beam" having a two-dimensional spread instead of scanning the electron beam as a "point beam" in order to increase the inspection speed higher than that of a technique using the scanning electron beam. The negative retarding voltage that has almost the same absolute value as that of an acceleration voltage is applied to the sample and its trajectory is inverted immediately before the electron beam being irradiated to the sample collides against the sample. The irradiation electron beam is inverted with respect to the trajectory on an equipotential plane formed above the sample by the retarding voltage, and a contrast that depends on a gradient of this equipotential plane is formed as an image. This technique is very excellent in sensitivity to the gradient of the equipotential plane, but on the other hand, causes a large beam shift due to distortion of the equipotential plane at the sample edge, which makes it difficult to acquire the image.

As a method of making uniform the electric field generated above the sample by the retarding over the whole sample surface and thereby lowering the disturbance of the image, a method of installing an electrode for making the electric field in the sample peripheral part uniform is proposed in Japanese Unexamined Patent Application Publication No. 2000-149845. This method is one in which a conductor plate almost as high as a sample surface is disposed in the sample peripheral part above the sample holder leaving a minute gap to the sample and the conductor plate is brought into electrical conduction with the sample holder.

In addition, other methods are described in Japanese Unexamined Patent Application Publication No. 2004-235149 and Japanese Unexamined Patent Application Publication No. 2004-14251. In each of these methods, a conductor plate that is electrically isolated from the sample holder with an insulator is provided above the sample holder of the sample peripheral part. The conductor plate is connected to a power supply other than the power supply for supplying the retarding voltage and suppresses the disturbance of the electric field above the sample by applying an arbitrary voltage to the conductor plate.

SUMMARY OF THE INVENTION

When observing the whole sample surface, a configuration of having combined a linear stage and a rotary stage can reduce a capacity of a vacuum chamber better than a configuration with only linear stages, and is more advantageous to reduce chamber materials and to shorten a vacuum evacuating time. For example, when observing the whole surface of the sample of a diameter d, the stage only using linear stages needs an operating area of $4d^2$, while the stage that combines the rotary stage and the linear stage needs only an operating area of $1.5d^2$. Therefore, it is possible to reduce the capacity of the vacuum chamber by 63%.

Especially in the projection type inspection device, since it is greatly affected by an influence of electric field distortion in a sample edge, it is necessary to control the electric field distortion in a higher accuracy and to suppress the electric field distortion up to the sample edge for any samples.

Since in the method described in Japanese Unexamined Patent Application Publication No. 2000-149845, the voltage supplied to the sample holder is only a retarding voltage, it requires only one electrical wire, and even when the rotary stage is rotated, it does not happen that the wiring is tangled. However, since the voltage of the conductor plate is invariable, an equipotential plane is uniquely fixed by a height of the conductor plate and a gap between the sample and itself, and therefore it is difficult to control the equipotential plane finely, to correct the electric field distortion as far as the sample edge, and to observe the whole sample surface thoroughly.

Since in the methods described in Japanese Unexamined Patent Application Publication No. 2004-235149 and Japanese Unexamined Patent Application Publication No. 2004-14251, a sample holder and a conductor plate are electrically isolated from each other and a voltage different from the retarding voltage can be applied to the conductor plate, it is possible to form an optimal equipotential plane for observation of a sample without depending on the sample and a distance between the sample and the conductor plate. However, since two wirings one of which applies the retarding voltage and the other of which applies a voltage to the conductor plate are necessary, if the rotary stage is made to perform unlimited rotation, the two wirings will be tangled. Therefore, a rotation angle θ of the rotary stage will be limited to 0°≤θ<360°, and when an electron beam moves to an arbitrary observation place, there is a case where a rotation direction may be restricted, and it will take time compared with the above method of the unlimited rotation.

Thus, an object of the present invention is to provide a charged particle beam device that solves the above-mentioned problems and that has a rotary stage capable of an unlimited rotation and controls finely electric field distortion at the sample edge.

An aspect of the present invention will be shown as below. That is, the charged particle beam device according to the present invention includes: an irradiation optical system for irradiating a charged particle beam to a sample to be observed; an imaging optical system for imaging the charged particle beam emitted or reflected from the sample; a base stage for moving the sample; a rotary stage for rotating the sample on the base stage; and a sample electric field control mechanism that is provided in the periphery of the rotary stage independently from the rotary stage, and for varying the equipotential plane on the sample.

According to the present invention, it is possible to realize a charged particle beam device that has a sample stage capable of applying a retarding voltage and being unlimitedly rotatable, and can observe the whole sample surface without image distortion.

BRIEF DESCRIPTION OF THE DRAWINGS

FIG. 2 is a sectional view showing roughly structures of a stage mechanism and an electric field control mechanism of the first embodiment;

DESCRIPTION OF THE PREFERRED EMBODIMENTS

One example of a typical device according to the present invention is that a rotary stage is configured to be able to perform unlimited rotation by a retarding voltage applied to the sample from a rotation center, and an electric field control electrode for correcting electric field distortion at a sample edge is provided in the periphery of the sample. The electric field control electrode does not rotate even at the time of rotation of the sample and can apply the voltage, makes an equipotential plane on the sample vary by adjusting the voltage applied to the electric field control electrode, and suppresses the electric field distortion on the sample.

According to another aspect of the present invention, an optimal applied voltage of the electric field control electrode is measured for each of discrete rotation angles of the rotary stage, and obtained by performing an interpolation calculation from the applied voltages in the vicinity for the rotation angles between the measured angles. By the above procedure, image disturbance by the beam shift, etc. is eliminated and the whole sample surface becomes observable.

In addition, as another technique, an electric field control plate is provided on the sample holder so as to surround the periphery of the sample through an insulator. The electric field control plate is adjacent to the non-contacting electric field control electrode, and the electric field control electrode does not rotate even at the time of sample rotation. By applying a voltage to the electric field control electrode, the electric charges in the electric field control plate are moved, and the equipotential plane on the electric field control plate is made to vary. With its variation, the equipotential plane on the sample is made to vary, and the electric field distortion on the sample is suppressed.

In addition, as another technique, the electric field control plate is provided on the sample holder through an insulator so as to surround the periphery of the sample, and a charge control electron gun for irradiating the electric field control plate and an ultraviolet light source are installed. Electrons are made to accumulate in the electric field control plate by irradiating the electron beam to the electric field control plate, and the electrons are removed by a photoelectric effect done by irradiating ultraviolet light thereto. By controlling electric charges accumulating in the electric field control plate, the equipotential plane on the electric field control plate is varied; with this variation, the equipotential plane on the sample is varied; and the electric field distortion on the sample is suppressed.

Hereafter, embodiments of the present invention will be described in detail with reference to drawings.

First Embodiment

Figure 1:
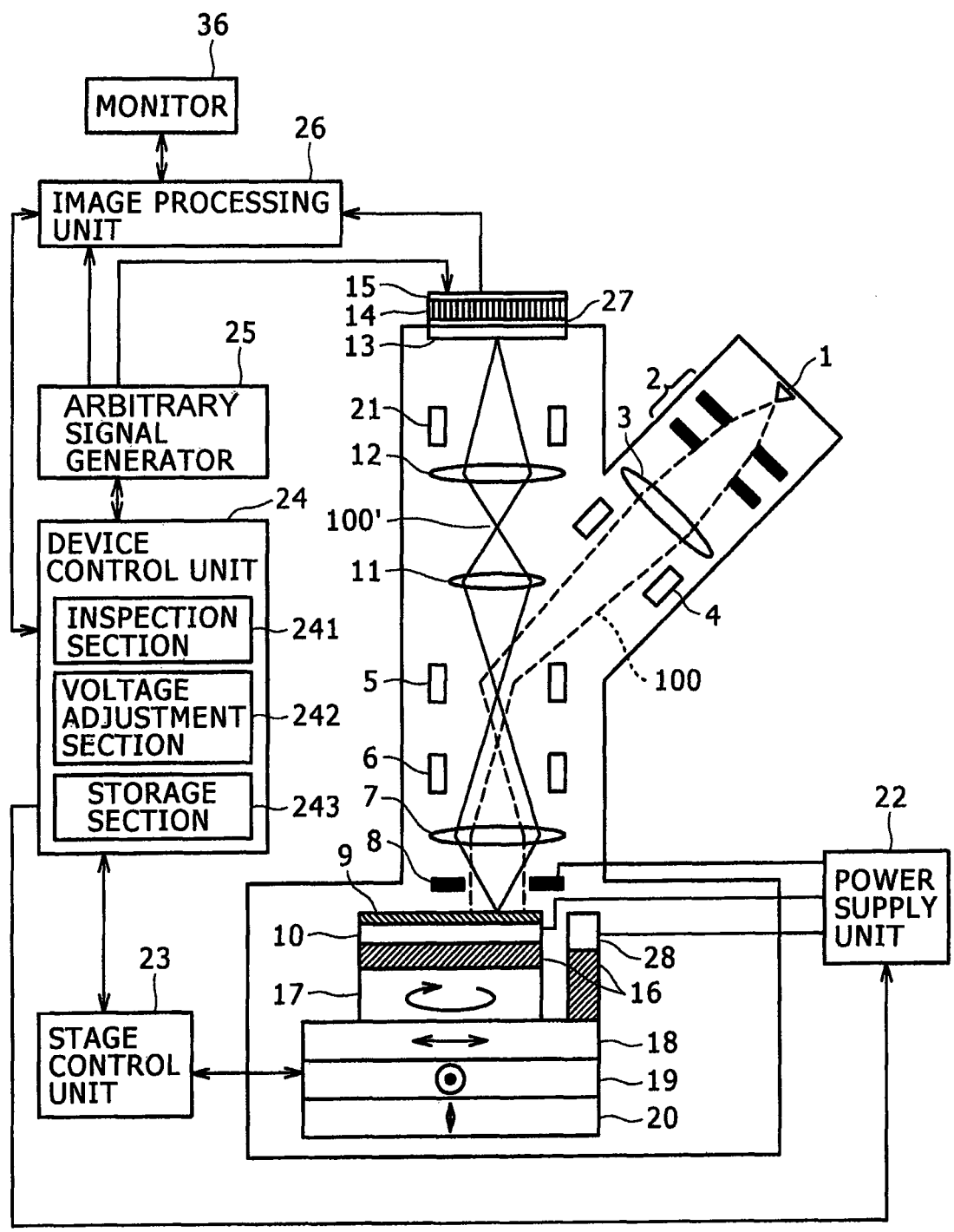
FIG. 1 is a diagram explaining an entire configuration of an inspection device according to a first embodiment of the present invention.

An inspection device that is according to a first embodiment of the present invention will be explained referring to FIG. 1 to FIG. 10. First, FIG. 1 shows an inspection device according to one embodiment of the present invention, namely an entire configuration of a charged particle beam device. This device roughly consists of an electron beam irradiation optical system, a mirror electron imaging optical system, a stage mechanical system, an electric field control mechanical system, an image detection system, and a control system. However, in this figure, a vacuum pump, its control device, an exhaust pipe, etc. are omitted. The electron beam irradiation optical system includes an electron gun 1, an extraction electrode 2, a condenser lens 3, a deflector 4 means for collimating the beam as main constituents. Although there are cases where various constituents are included in addition to these, their details are omitted. The mirror electron imaging optical system includes a hole electrode 8, an objective lens 7, an E×B deflector 5, an intermediate lens 11, and a projection lens 12 as main constituents. Although, regarding the mirror electron imaging optical system, there are also cases where various constituents are included in addition to these, their details are omitted.

In the electron beam irradiation optical system, a voltage is applied to the extraction electrode 2, and the optical system is configured to be able to adjust an extraction voltage and an acceleration voltage of an irradiation electron beam emitted from the electron gun 1. The irradiation electron beam emitted from the electron gun 1 is focused by the condenser lens 3 and is deflected by the E×B deflector 5 to form the crossover, subsequently is converted into a collimated beam by the object lens 7 (or into an electron beam having a specific area), and is irradiated on a sample 9.

Since the irradiation electron beam is deflected to be in an optical axis normal to the sample 9, the E×B deflector 5 has a deflection action only to the electron beam heading to the sample side from the electron source side and is functioning as a beam separator. Since the irradiation electron beam deflected by the E×B deflector 5 becomes a collimated beam by the objective lens 7, it irradiates an area having a large spread as wide as a few 10 μm.

A negative voltage (retarding voltage) V whose absolute value is almost equal to that of the acceleration voltage of the electron beam or is slightly larger than that of the acceleration voltage is applied to the sample 9 by a power supply unit 22. The irradiation electron beam is decelerated by this retarding voltage in front of the sample 9, is reflected, and is pulled back upward as mirror electrons. Since the incident electrons do not touch the surface, or even if they touch it, the quantity of electrons is small, it is hard for the electric charges to accumulate in the sample surface. Therefore, contamination is hardly adhered thereto and it does not happen that the sample surface gets contaminated. These mirror electrons have information that reflects an electric potential distribution of the surface. That is, the mirror electrons reflect unevenness information of the surface, charge information according to a difference of the material, etc. These mirror electrons receive a focusing action by the objective lens 7, rose vertically, as they are, because the E×B deflector 5 does not have a deflection action to the electron beam that advances from the lower part, and are projected to a fluorescent screen 13 by the intermediate lens 11 and the projection lens 12. The reference numeral 21 is an imaging system deflector.

An image detection system includes the fluorescent screen 13, an optical image transfer part 14, an optical image detector 15, and a detector rotating mechanism 27, and converts the projected mirror electrons into an electric signal. A CCD camera or TDI sensor is used as the optical image detector 15. A TDI sensor is an image capturing device having a mode of performing time delayed integration type image acquisition.

A TDI sensor is desirable in the case of taking pictures continuously while rotating the sample 9. When using a TDI sensor as the optical image detector 15, a pixel integration direction of the TDI sensor 15 and a linear velocity vector direction of rotation of the observed image are made to agree with each other using the detector rotating mechanism 27. Moreover, the charge transfer speed of the TDI sensor 15 and the image travel speed on the light receiving plane are made to agree with each other by adjusting a trigger signal outputted from an arbitrary signal generator 25 to the TDI sensor 15 and a rotation speed of a rotary stage 17. An image processing unit 26 stores a design pattern of a structure of the sample 9, and when the image processing unit 26 detects a defect from an acquired image, the signal is sent to a device control unit 24 and is saved after being correlated with a coordinate position sent from the stage. Incidentally, here, the image includes an output signal of the optical image detector, two-dimensional intensity distribution data, etc.

Operation commands and operation conditions of every part of the charged particle beam device are inputted and outputted through the device control unit 24. The device control unit 24 is made up of an information processing device equipped with a CPU, memory, a program, etc. The device control unit 24 has an inspection part 241 having a function of performing observation and inspection of the sample 9, a voltage adjustment part 242 having a function of correcting the equipotential plane at the sample edge, and a storage part 243 for retaining data relevant to them, these functions being functions related to the present invention.

The image processing unit 26 is connected to a monitor 36, and a captured electron beam image or optical image is outputted and displayed on the monitor 36. This monitor 36 includes a GUI function. The charged particle beam device is configured to enable conditions, such as the acceleration voltage, a deflection width of the electron beam, a deflection speed, and a movement speed of a sample holder 10, to be inputted into the device control unit 24 appropriately according to the object by operating a display screen of the monitor 36 and other input means (illustration omitted).

The stage mechanical system has a configuration in which a linear stage and the rotary stage are combined. That is, the stage mechanical system has mainly an X-stage 18 and a Y-stage 19 that constitute the linear stage for linearly moving the sample in the X-Y plane, a θ-stage 17 that constitutes the rotary stage for rotating the sample in the X-Y plane, a Z-stage 20 for varying a position of the sample in a height (Z) direction, and a stage control unit 23 for controlling these. Thus, the rotary stage is installed on a base stage consisting of the linear stage and a Z-stage.

After observing the image at each of a predetermined rotation angle of the rotary stage in a position away from the sample edge, the voltage adjustment part 242 of the device control unit 24 moves the linear stage in the direction of the electric field control mechanism, stops the movement of the linear stage when the acquired image starts to perform an image shift, and makes the equipotential plane on the sample vary by controlling the electric field control mechanism. By this procedure, the image shift is canceled. That is, by repeating the movement by the linear stage and the cancellation of the image shift by controlling the electric field control mechanism, the device control unit 24 obtains a setup voltage of the electric field control mechanism that enables the sample to be observed as far as its edge and retains the data in a storage part 243.

Moreover, the inspection part 241 of the device control unit 24 obtains the data of the storage part 243, namely the setup voltage of the electric field control electrode that enables the sample to be observed as far as the edge part in discrete rotation angles of the rotary stage, obtains the setup voltage between the measurement angles by performing an interpolation calculation from the setup voltages at the measurement angles in the vicinity, and enables the whole sample surface to be observed without occurrence of the image shift of the sample whole surface.

In order not to apply the voltage to the stages 17 to 20 and to apply the retarding voltage to the sample 9, an insulator 16 is attached between the sample holder 10 and the θ-stage 17, and the power supply unit 22 applies the voltage to the sample 9 and the sample holder 10. FIG. 1 shows a case where the retarding voltage is applied only to the sample 9 and the sample holder 10. In the case where the voltage is applied also to the θ-stage 17, an insulator is inserted between the θ-stage 17 and the X-stage 18.

The electric field control mechanical system is provided in the peripheral part of the sample 9, has an electric field control electrode 28, and is provided on the X-stage 18 through the insulator 16. In order to suppress the disturbance of the electric field in the sample 9 edge, a predetermined voltage is applied to the electric field control electrode 28 from the power supply unit 22 through a first wiring 44.

A stage mechanism of this embodiment includes a function that the θ-stage 17 and constituents above the θ-stage 17 rotate the sample relative to the X-stage 18. On the other hand, the electric field control electrode 28 is provided on the X-stage 18 independently from the θ-stage 17, and the electric field control electrode 28 does not rotate at the time of rotation of the sample by the θ-stage 17.

The stage mechanical system and a voltage application mechanical system of this embodiment will be explained with FIG. 2. FIG. 2 is a longitudinal sectional view of the sample stage and its vicinity in the first embodiment, which is drawn omitting the X-stage 18 and some higher-numbered constituents. The θ-stage 17 includes a fixation-side stage 17A provided on the X-stage 18, a rotation-side stage 17B rotating with the sample 9 integrally, and a motor for driving a bearing 31 and the rotation-side stage 17B, for example, a step motor (illustration omitted), and is so configured that the rotation-side stage 17B is rotatable relative to the fixation-side stage 17A for every arbitrary angle step. A holder receiver 29 is provided between the sample holder 10 and the insulator 16, and a retarding electrode 30 for applying the retarding voltage is in contact with the holder receiver 29. The retarding voltage is applied to both the sample 9 and the sample holder 10 from the power supply unit 22 through a second wiring 45 and the holder receiver 29. The retarding electrode 30 is in contact with the holder receiver 29 at its rotation center, and a friction is decreased while securing conductivity by applying conductive grease, etc. in this contact part.

This makes it possible to reduce an area of the holder receiver 29 side of the θ-stage (rotary-side stage 17B) with which the retarding electrode 30 is in contact at the time of rotation, and to lower generation of dusts. Moreover, this leads also to making small a relative velocity at the time of contact of the retarding electrode 30 and the holder receiver 29, and is effective also for stabilizing the retarding voltage in the sample 9. Since the wiring of the retarding electrode 30 is not fixed to the holder receiver 29, but is in contact therewith, the wiring is not tangled with itself when the θ-stage 17 performs unlimited rotation. Moreover, since the electric field control electrode 28 is provided on the X-stage 18, it is not tangled with the wiring for applying a voltage to the electric field control electrode 28 even at the time of rotation of the θ-stage 17.

Figure 3:
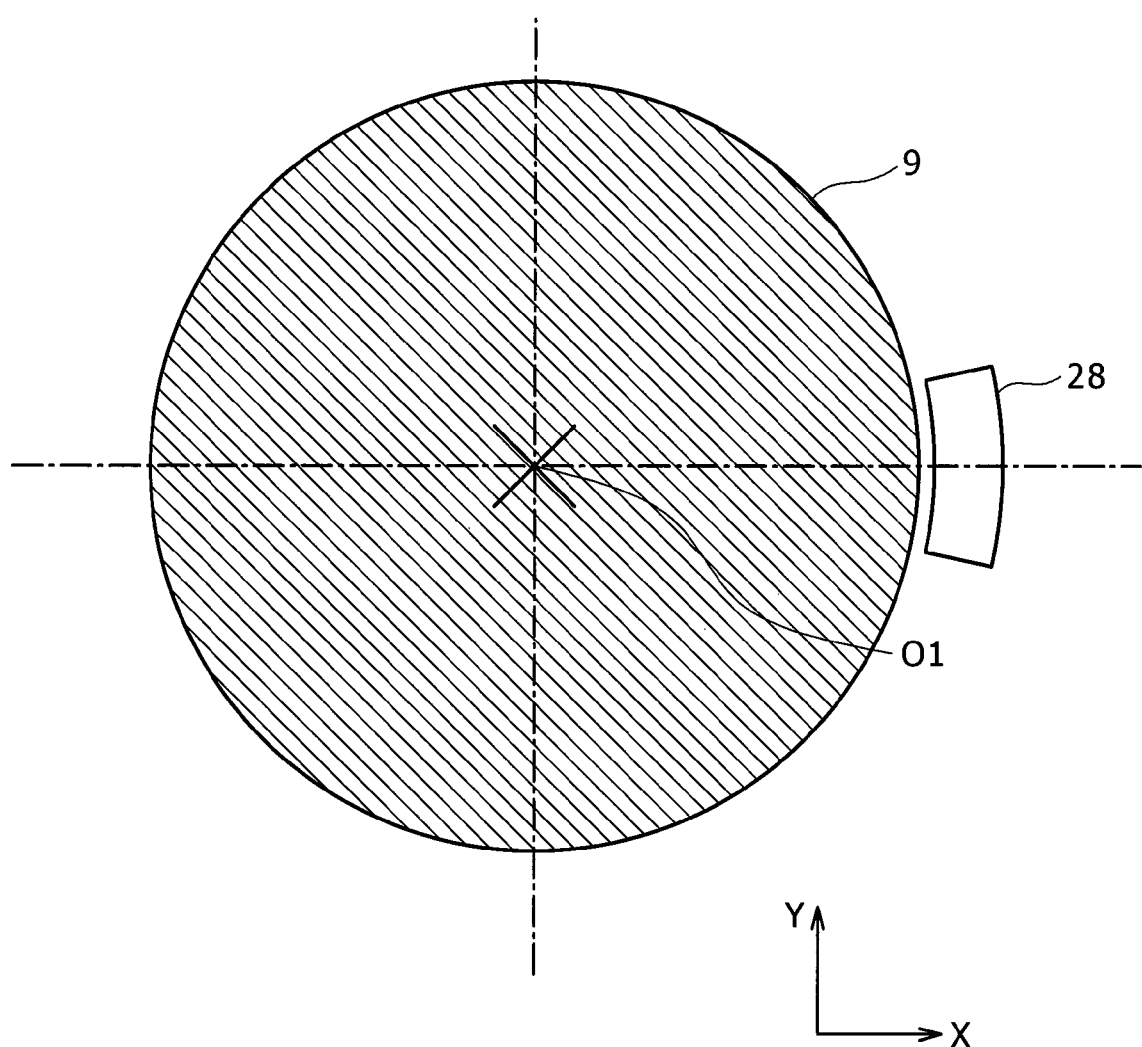
FIG. 3 is a plan view showing roughly the structures of the stage mechanism and the electric field control mechanism of the first embodiment.

FIG. 3 is a diagram of the sample 9 of FIG. 2 and the electric field control electrode 28 when seeing them from above. In the case where this embodiment includes the rotary stage, only an area on a specific radius that elongates from the rotation center O1 of the θ-stage toward the electric field control electrode 28 (in the example of the figure, in the X-axis direction) is sufficient as an irradiation area of the electron beam required to observe the whole sample surface. Therefore, it is not necessary for the electric field control electrode 28 to be provided over the whole periphery of the sample 9. From a result of an experiment, it is all right that the length of the electric field control electrode 28 in a circumferential direction measures 10 mm or more and it is not necessary to lengthen it so much.

Figure 4A:
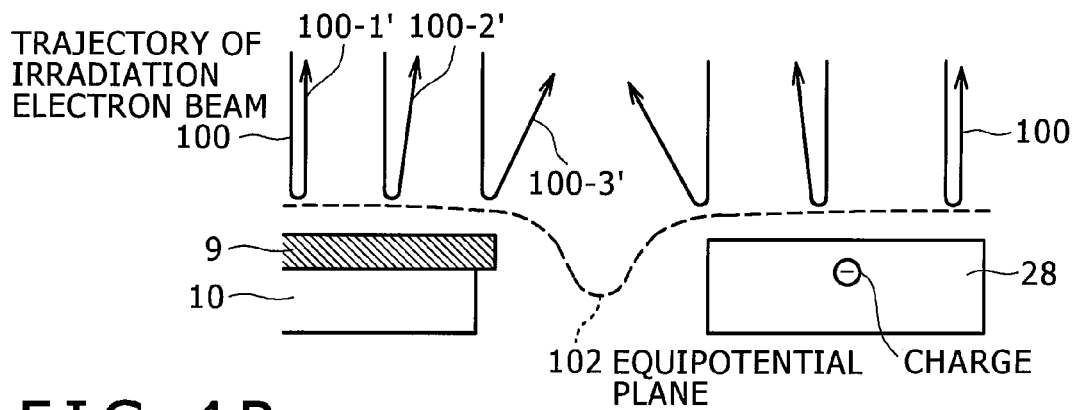
FIG. 4A is a diagram showing roughly an equipotential plane at a sample edge of the first embodiment.

Next, a procedure of adjusting the applied voltage of the electric field control electrode 28 will be explained using FIG. 4. FIGS. 4A, 4B, 4C, and 4D schematically show a state of an equipotential plane 102 that is formed on the sample 9 and the electric field control electrode 28 and a trajectory of an irradiation electron beam 100 when the retarding voltage is applied to the sample 9 and the sample holder 10 and a voltage is applied also to the electric field control electrode 28. FIG. 4A shows a state of the equipotential plane 102 when the same voltage V as the retarding voltage V applied to the sample 9 and the sample holder 10 is applied to the electric field control electrode 28. Negative charges are accumulated in the electric field control electrode 28 by a negative voltage applied from the power supply unit 22. Since a gap exists between the sample 9 and the electric field control electrode 28, the equipotential plane 102 lowers in the gap part. The equipotential plane 102 on the sample 9 is also lowering gradually as the electron beam approaches this gap part. The irradiation electron beam 100 is reflected on the equipotential plane, and in a part on the sample 9 where the equipotential plane is horizontal, the equipotential plane inverts the trajectory of the electron beam by 180° relative to an incident direction thereof (100-1'). As the electron beam approaches the sample edge, the equipotential plane starts to incline and a reflection angle of the electron beam starts to deviate from a normal direction of the sample 9 (100-2'). This deviation appears as the image shift in a projection image, and the image shifts from the center of the fluorescent screen. When the electron beam approaches the sample edge further, a reflection direction thereof further deviates from the normal direction of the sample 9 (100-3'), the amount of image shift becomes larger, eventually the projection image goes out of the fluorescent screen completely, and it becomes difficult to observe it. From a result of an experiment, it has become clear that the image shift starts from a position about 5 mm away from the sample edge in the radial direction.

Figure 4B:
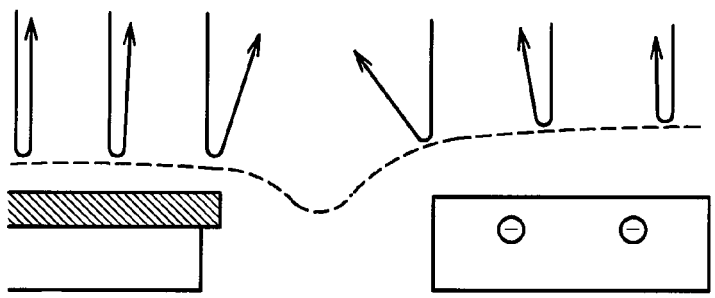
FIG. 4B is a diagram showing roughly an equipotential plane at a sample edge of the first embodiment.
Figure 4C:
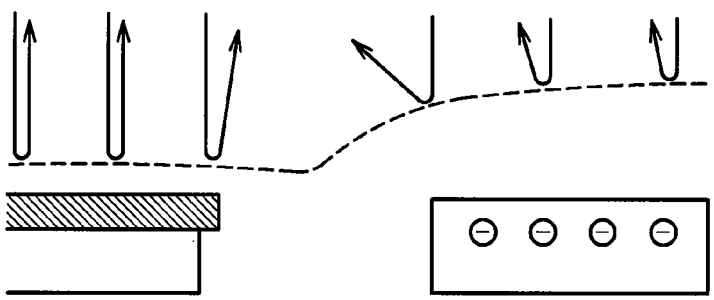
FIG. 4C is a diagram showing roughly an equipotential plane at a sample edge of the first embodiment.
Figure 4D:
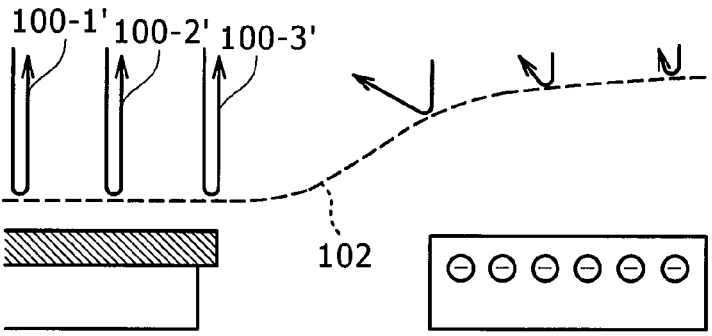
FIG. 4D is a diagram showing roughly an equipotential plane at a sample edge of the first embodiment.

Then, if a negative voltage from the voltage of a state of FIG. 4A is applied to the electric field control electrode 28, the equipotential plane on the electric field control electrode 28 will be lifted as shown in FIG. 4B. As the equipotential plane rises, the gradient of the equipotential plane on the sample 9 approaches horizontality and an area in which the irradiation electron beam reflects to the normal direction of the sample 9 can be expanded to a direction of the sample edge. If the negative voltage is being applied to the electric field control electrode 28 further, the equipotential plane on the electric field control electrode 28 will be lifted further as shown in FIGS. 4C and 4D, and as the equipotential plane rises, the equipotential plane on the sample 9 will be also lifted, so that the equipotential plane can be made horizontal as far as the edge of the sample 9. Thereby, it becomes possible to invert also the trajectory of the electron beam at the edge of the sample by 180° relative to the incident direction (100-3'). By maintaining the voltage of the electric field control electrode 28 at this time, the projection image becomes observable as far as the edge of the sample 9.

In an actual charged particle beam device, the distance L between the sample 9 and the electric field control electrode 28 and the height vary depending on the rotation angle of the θ-stage 17 due to error factors, such as manufacture accuracy of the stage, and a method of setting up the sample to the holder. With this variation, the shape of the equipotential plane also varies, and the applied voltage of the electric field control electrode 28 that enables the sample 9 to be observed as far as the edge also varies. Because of this fact, for each rotation angle of the θ-stage 17 with a certain step, the applied voltage of the electric field control electrode 28 that enables the sample 9 to be observed as far as the edge is measured individually. Then, the applied voltage between the measured angles is calculated by interpolating the applied voltages in its vicinity. By applying the voltage obtained by the above procedure to the electric field control electrode 28 for an arbitrary rotation angle of the θ-stage 17, the whole surface of the sample 9 becomes observable by means of the projection image.

Figure 5:
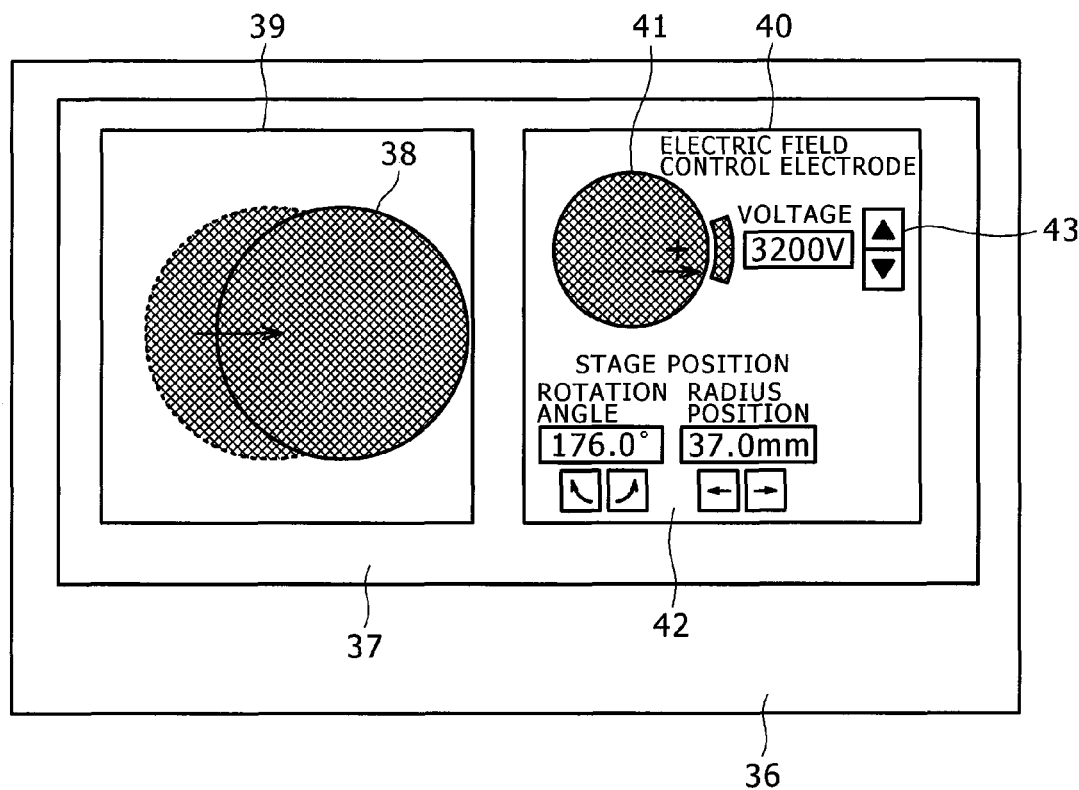
FIG. 5 is a GUI screen for adjusting the electric field control mechanism according to the first embodiment.

Next, the configuration of the monitor 36, especially a configuration of the GUI screen required in order to realize a function of the voltage adjustment part 242 and minimum functions included therein will be explained using FIG. 5. A GUI screen 37 of the monitor 36 consists of an image display part 39 for displaying the observed image 38, and a stage-voltage operation part 40 whereby an operation of a stage position and the applied voltage to the electric field control electrode 28 are operated. In order to correct the equipotential plane at the sample edge, an operator moves the stage position (the rotation angle $\theta_x$, the radius position R) by operating a stage position operation part 42 while seeing an image 41 of an observed position of the sample displayed in the stage-voltage operation part 40, and adjusts the applied voltage $V_c$ to the electric field control electrode 28 by operating a voltage operation part 43 while observing a variation (image shift) of the image (projection image) 38 of the image display part 39 that accompanies it.

Figure 6:
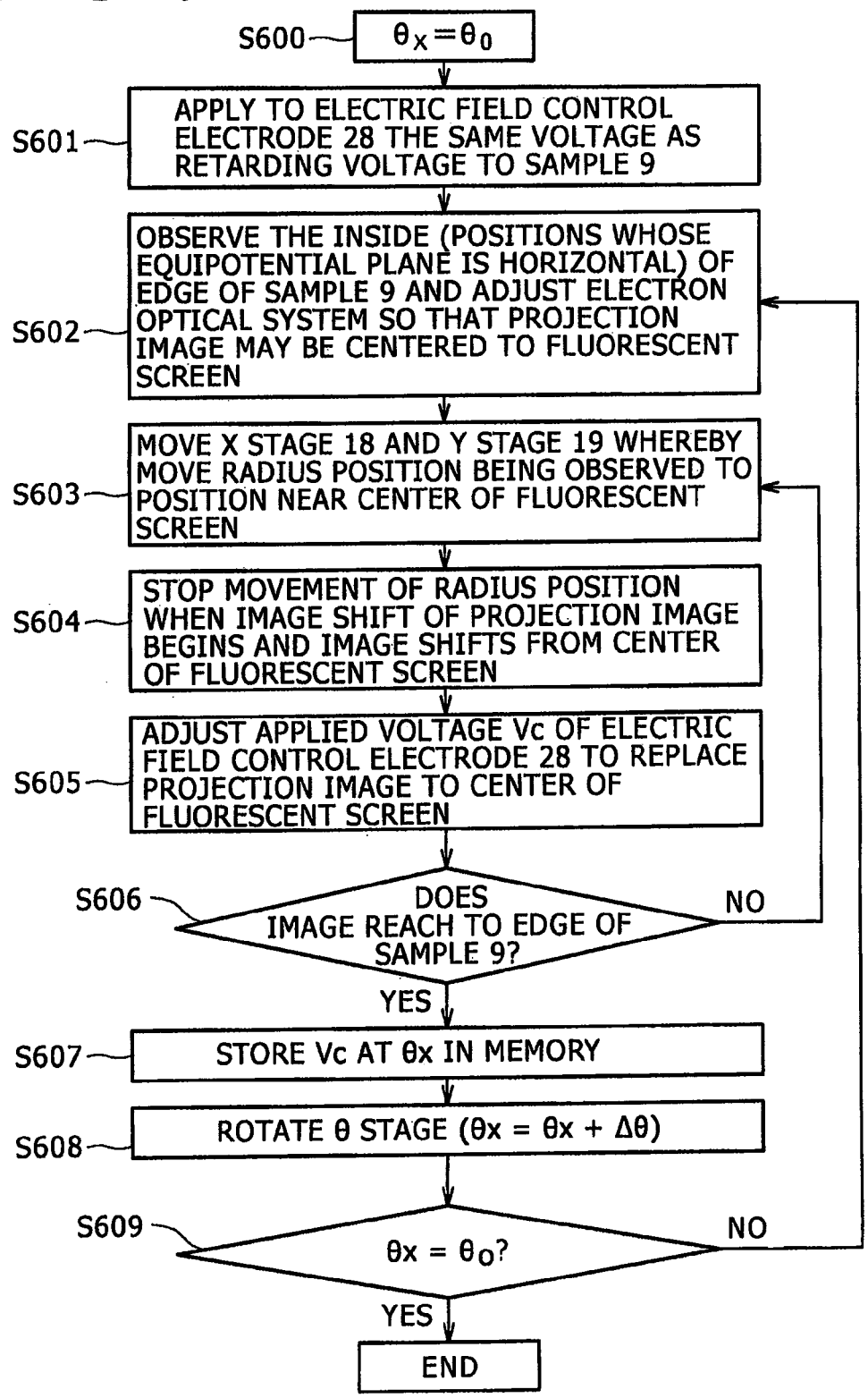
FIG. 6 is a diagram showing a flow of an adjustment procedure of the electric field control mechanism according to the first embodiment.

A processing procedure of adjusting the applied voltage of the electric field control electrode 28 that is performed by the voltage adjustment part 242 of the device control unit 24 is summarized as a flow in FIG. 6.

First, at Step 600, the operator performs initialization about observation conditions by an input operation from the GUI screen 37 of the monitor 36, or other operations. At this time, the rotation angle $\theta_x$ of the θ-stage 17 is assumed to be $\theta_x=\theta_o$. Next, at Step 601, the same voltage V as the retarding voltage is applied to the electric field control electrode 28 from the power supply unit 22. At Step 602, a sample position whose equipotential plane is horizontal is observed and an electron optical system (the electron beam irradiation optical system and the mirror electron imaging optical system) is adjusted. Although regarding the observation of the sample position, the observation may start at a position of the sample center, it is desirable to set it up in advance in such a way that the observation starts at a position slightly inner than a position about 5 mm from the sample edge. At Step 603, a position on the radius to be observed is moved outwardly, namely in a direction approaching the electric field control electrode 28.

For example, the operator checks the observed image 38 and the image 41 of the observation position in the GUI screen 37 of the observation monitor 36, performs interactive operations through the stage-voltage operation part 40, and adjusts the applied voltage $V_c$ applied to the electric field control electrode 28 by operating the voltage operation part 43. The device may adjust automatically by an image processing.

At Step 604, if the image shift occurs on the display screen of the monitor 36, the stage movement will be halted. At Step 605, the applied voltage $V_c$ of the electric field control electrode 28 is adjusted to restore the image shift. For example, the operator observes the observed image 38 of the observation monitor 36 and the image 41 of the observation position, performs interactive operations through the stage position operation part 42, and adjusts the stage position R. The device may perform the adjustment automatically by image processing.

Hereafter, the steps from Step 603 to Step 605 are repeated, and the applied voltage value of the electric field control electrode 28 that enables the sample to be observed as far as the sample peripheral edge is obtained (Step 606).

At Step 607, the applied voltage $V_c$ at the rotation angle $\theta_x$ is recorded in a table of the memory. At Step 608, the rotary stage is rotated by $\Delta\theta$ ($\theta_x=\theta_x+\Delta\theta$). $\Delta\theta$ is set up to a predetermined value in advance, such as, for example, 30°, 60°, or 90°. At Step 609, it is determined whether the rotation angle of the rotary stage 17 becomes 360°, i.e., $\theta_x=\theta_o$ is attained, and when $\theta_x=\theta_o$ does not hold, Step 602 to Step 609 are repeated similarly. By this procedure, it is possible to obtain the applied voltage $V_c$ of the electric field control electrode 28 with respect to an arbitrary angle $\theta_x$ that enables the whole surface of the sample to be observed.

Figure 7:
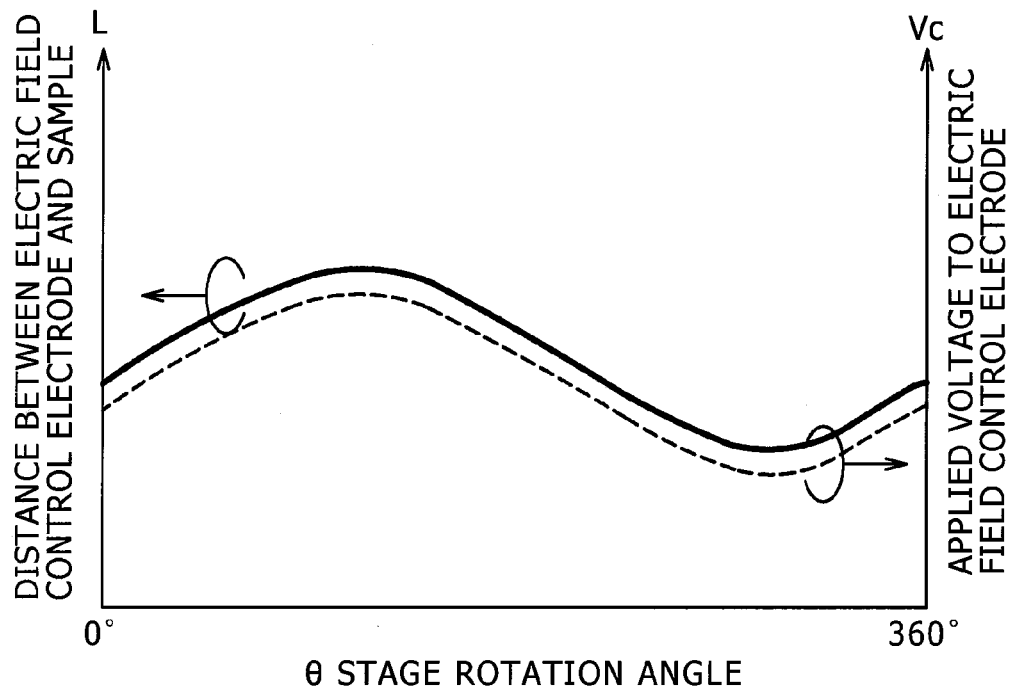
FIG. 7 is a rough diagram showing relations of a variation of a distance L between an electric field control electrode and a sample and of an applied voltage $V_c$ applied to the electric field control electrode with respect to a rotation angle of a θ-stage in the first embodiment.

FIG. 7 is a schematic diagram showing relations of a variation of a distance L between the electric field control electrode and the sample and of the applied voltage $V_c$ to the electric field control electrode with respect to the rotation angle of the θ-stage 17. In response to a variation of the rotation angle $\theta_x$ of the θ-stage, the distance L between the electric field control electrode and the sample varies like a solid line of FIG. 7, and in correspondence to this, the applied voltage $V_c$ to the electric field control electrode also varies like a dashed line of FIG. 7.

Figure 8:
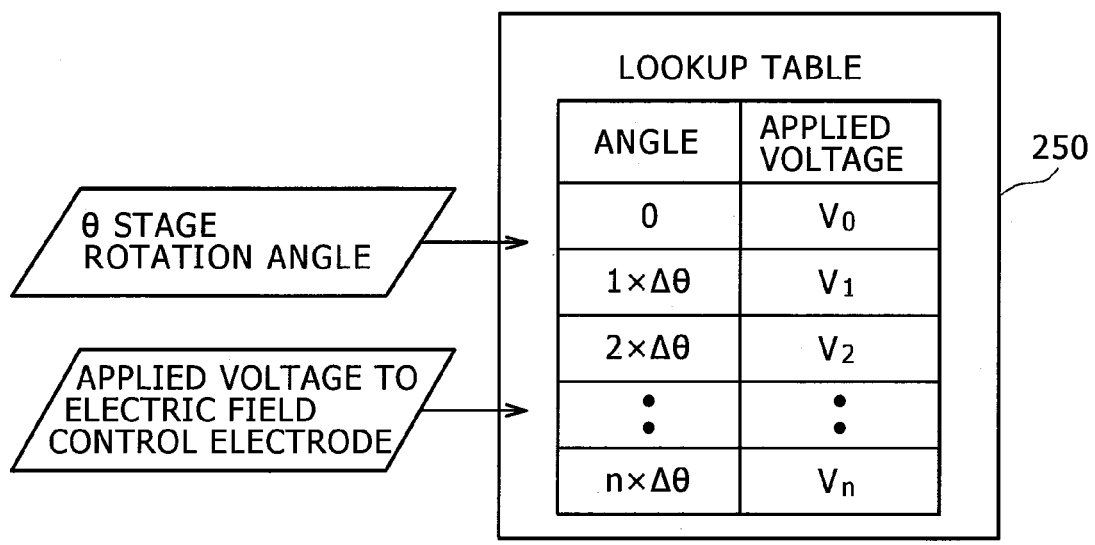
FIG. 8 is a diagram showing one example of a look-up table showing a relation between the θ stage rotation angle and the applied voltage to the electric field control electrode that was obtained by recording on a table of memory in the flow of FIG. 6.

FIG. 8 shows one example of a look-up table 250 showing a relation between the θ-stage rotation angle and the applied voltage $V_c$ to the electric field control electrode 28 that was obtained by performing storage operations in the table of the memory at Step 607 of FIG. 6.

Reference to the look-up table 250 enables the applied voltage $V_c$ that should be applied to the electric field control electrode 28 to be obtained for an arbitrary θ-stage rotation angle.

Figure 9:
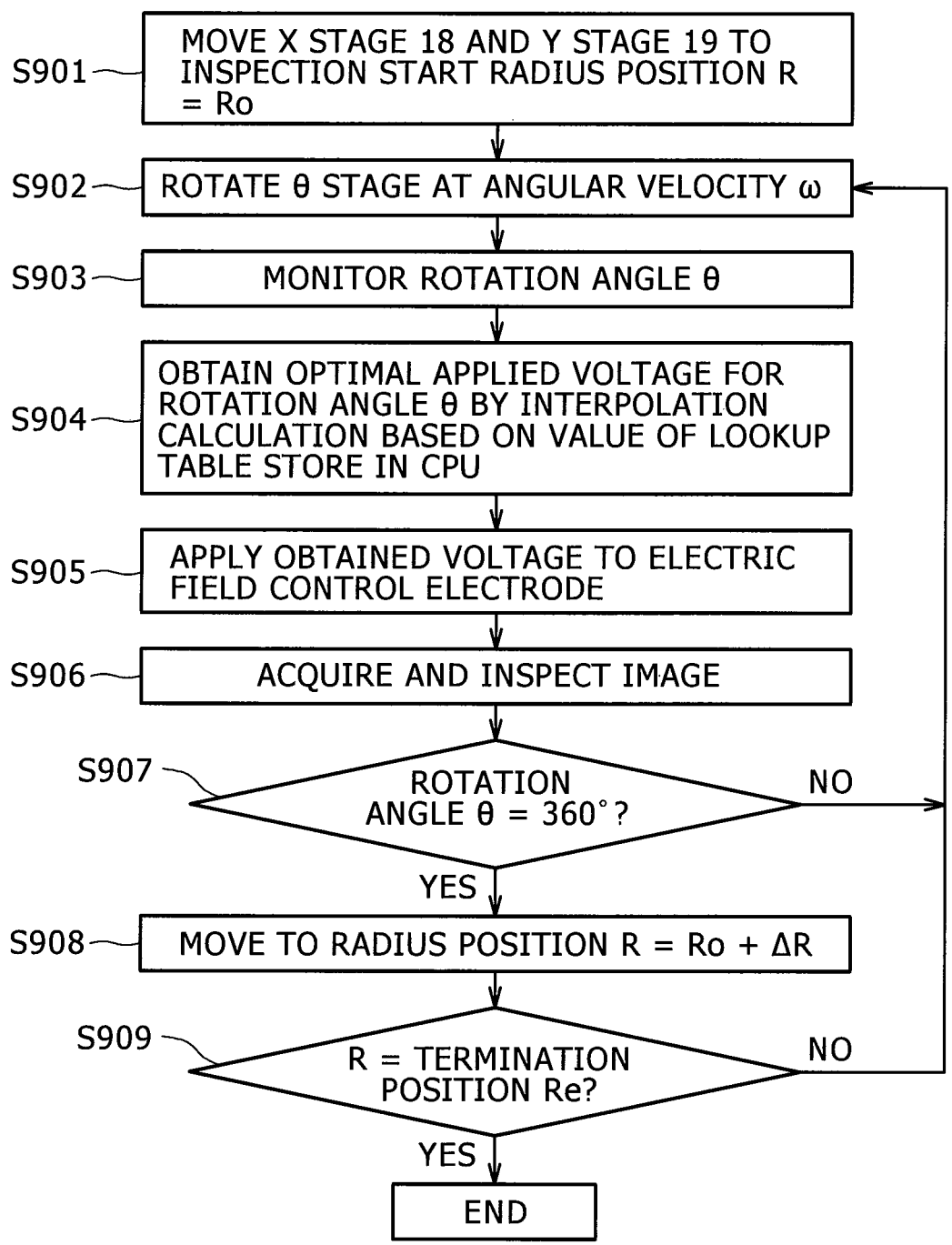
FIG. 9 is a diagram showing a flow of a procedure of observation and inspection of the sample in the first embodiment.

Next, a function of performing the observation and inspection of the sample 9 by irradiation of the irradiation electron beam 100 that is performed by the inspection part 241 of the device control unit 24 in the device of this embodiment will be explained referring to FIG. 9 and FIG. 10.

First, the operator performs initialization of inspection conditions by the input operation from the GUI screen (screen for inspection) of the monitor 36. Next, the X-stage 18 and the Y-stage 19 are moved to an inspection start radius position R at Step 901 of FIG. 9. In this embodiment, the inspection by the irradiation of the irradiation electron beam 100 shall be started from the peripheral edge (R=$R_o$) of the sample 9. At Step 902, the θ-stage 17 is rotated at an angular velocity ω. The rotation angle θ is monitored at Step 903. At Step 904, based on values of the look-up table 250 saved in the storage device of the device control unit 24, the optimal applied voltage $V_c$ with respect to the monitored rotation angle θ is obtained. For an angular range that lacks data directly corresponding to the monitored rotation angle θ, an arithmetic processing device of the device control unit 24 obtains the optimal applied voltage $V_c$ by an interpolation calculation. At Step 905, the obtained voltage $V_c$ is applied to the electric field control electrode. Thereby, at the monitored rotation angle, the electron beam becomes in a state in which its trajectory can be inverted by 180° to the incident direction of the irradiation electron beam 100 even at the edge of the sample 9. In such a state, next, an image is acquired as Step 906. This acquired image is processed in the image processing unit 26, and is subjected to a detection processing to detect existence/absence of a defect of the sample surface. At Step 907, it is determined whether the θ-stage 17 made a 360° rotation, and if it did not make the rotation, the processing of Step 902 and later steps will be repeated. When the θ-stage 17 rotated by 360°, the X-stage 18 and the Y-stage 19 are moved to a radius position $R=R_o+\Delta R$ at Step 908. In the case of this embodiment, they are moved so that the inspection position may be located inside the sample in the radial direction. At Step 909, it is determined whether the inspection position reaches a termination (R=Re), for example, the center of the sample, and if it does not reach, the processing of Step 902 and later steps will be repeated.

Figure 10:
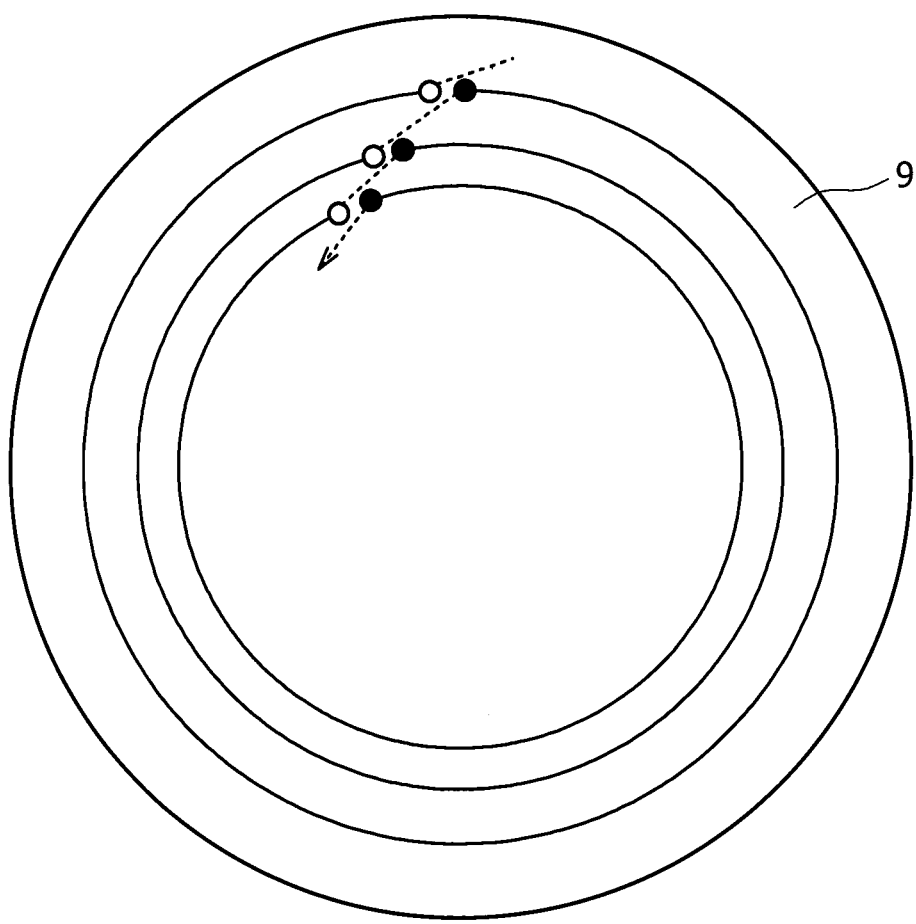
FIG. 10 is a diagram showing a trajectory of the electron beam on the sample surface in a second embodiment.

If the operation of moving the radius by a minute distance ΔR after inspecting 360° is repeated like this embodiment, the trajectory of the irradiation electron beam 100 on the sample surface is represented by plural concentric circles with different radii as shown in FIG. 10. That is, since the rotary stage can perform the unlimited rotation, it is possible to rotate it by plural times continuously in the same direction in inspecting a sheet of the sample surface. Thereby, the whole surface of the sample surface or an arbitrary area can be inspected in a short time. The trajectory of the electron beam on the sample surface is not restricted to the example shown in FIG. 10 and, for example, it may be rotated continuously in one direction from the center side of the sample to the outer side. Alternatively, the procedure may be altered in such a way that an arbitrary scanning pattern including alterations of a movement quantity ΔR in the radial direction and a rotation direction is set up, and an arbitrary observation place having a possibility that contamination may exist is subjected to more detailed additional inspection.

According to this embodiment, by adjusting the voltage applied to the electric field control electrode using data of the look-up table 250 obtained as described above for each charged particle beam device, it is possible to vary the equipotential plane on the sample and thereby to suppress the electric field distortion at the sample edge. According to this embodiment, the configuration of the electric field control electrode becomes simple. Moreover, by applying the retarding voltage applied to the sample from the rotation center, the rotary stage can perform the unlimited rotation. Therefore, the rotation direction of the rotary stage is not restricted, and consequently, the rotary stage can be moved to an arbitrary observation place promptly; thereby, it is possible to shorten an observation time.

Second Embodiment

Figure 11:
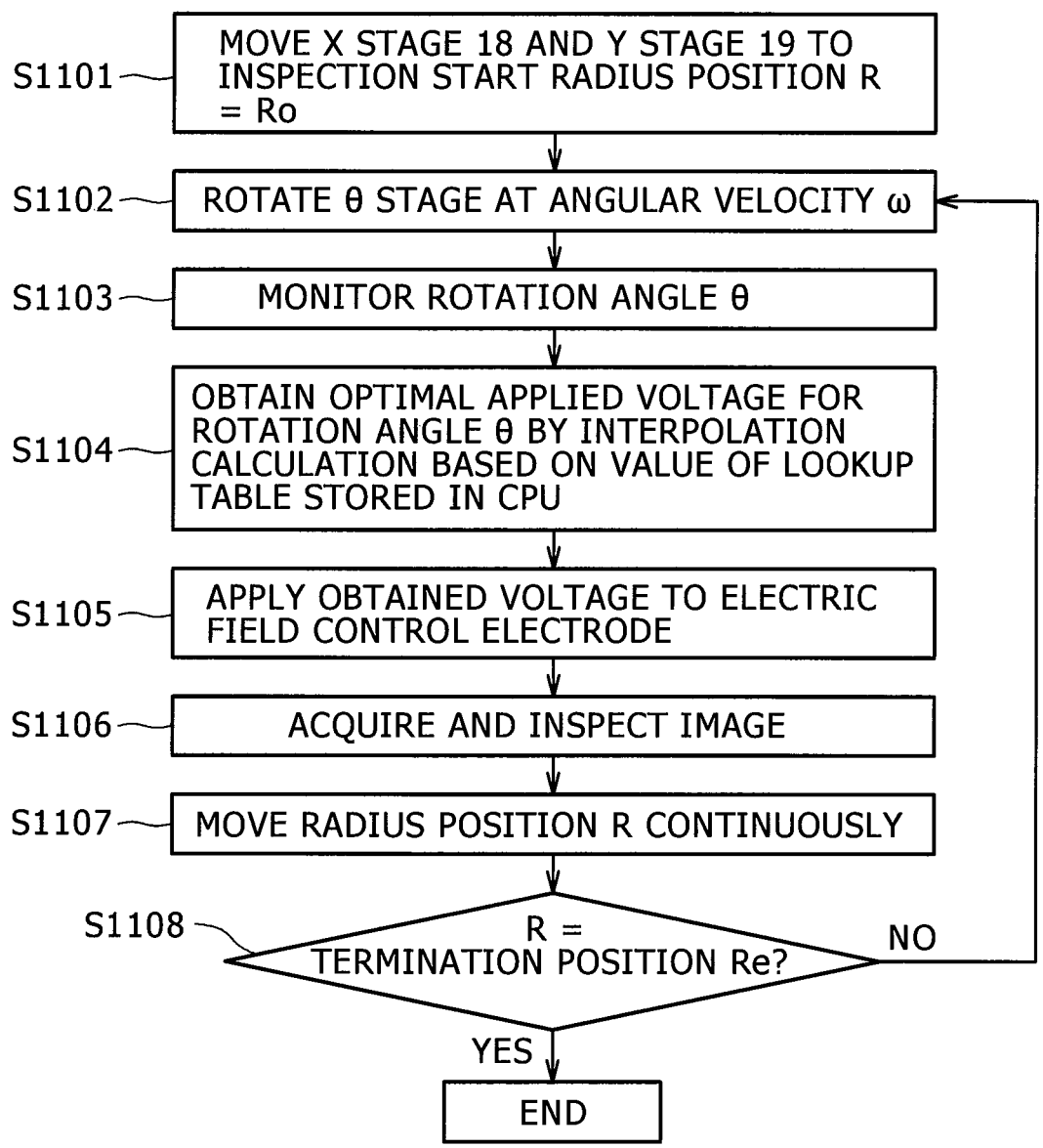
FIG. 11 is a diagram showing a flow of a procedure of observation and inspection of the sample in the second embodiment of the present invention.

Next, another example of performing the observation and inspection of the sample 9 that is performed by the inspection part 241 of the device control unit 24 in the device of the first embodiment will be explained referring to FIG. 11 and FIG. 12.

First, the operator performs initialization of the inspection conditions by the input operation from the GUI screen of the monitor 36, etc. Step 1101 through Step 1106 of FIG. 11 are the same as Step 901 through Step 906 of FIG. 9 of the first embodiment. The image acquired at Step 1106 is processed in the image processing unit 26, and is subjected to the detection processing to detect the existence/absence of a defect of the sample surface. In this embodiment, the X-stage 18 and the Y-stage 19 are moved little by little from the radius position $R_o$ continuously, for example, to the inside in the radial direction (Step 1107). Next, at Step 1108, it is determined whether the inspection position reaches the termination (R=Re), for example, the center of the sample, and if it does not reach, the processing of Step 1102 and later steps will be repeated.

Figure 12:
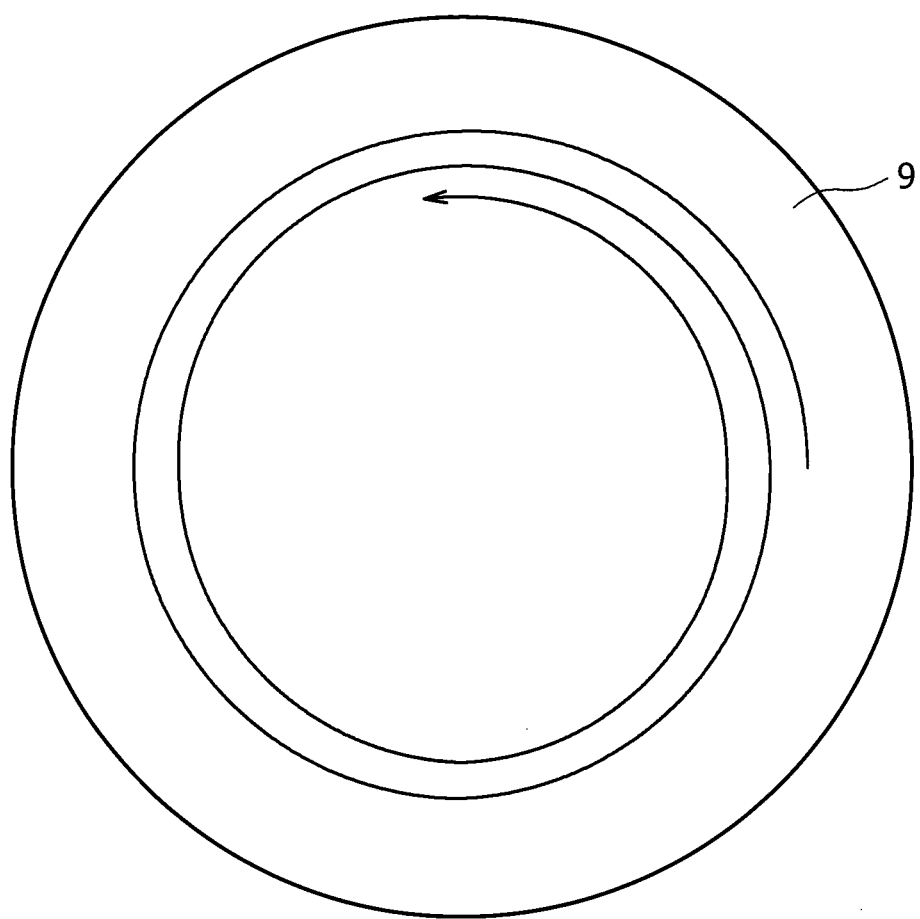
FIG. 12 is a diagram showing the trajectory of the electron beam on the sample surface in the second embodiment.

When the operation of moving the radius continuously is repeated like this embodiment, the trajectory of the irradiation electron beam 100 on the sample surface is represented by one continuous spiral curved line as shown in FIG. 12. That is, since the rotary stage can perform the unlimited rotation, when performing the inspection on one sheet of the sample surface, the rotary stage can be rotated in multiple times in the same direction continuously. Thereby, the whole surface of the sample surface or an arbitrary area can be inspected in a short time. The trajectory of the electron beam on the sample surface is not restricted to the example shown in FIG. 12 and, for example, it may be rotated continuously in one direction from the center side of the sample to the outer side.

According to this embodiment, by adjusting the voltage applied to the electric field control electrode using the data of the look-up table 250 obtained by doing as described above for each charged particle beam device, it is possible to vary the equipotential plane on the sample and thereby to suppress the electric field distortion at the sample edge. According to this embodiment, a configuration of the electric field control electrode becomes simple. Moreover, by applying the retarding voltage applied to the sample from the rotation center, the rotary stage can perform the unlimited rotation. Therefore, the rotation direction of the rotary stage is not restricted, and consequently, the rotary stage can be moved to an arbitrary observation place promptly; thereby, it is possible to shorten the observation time.

Third Embodiment

Figure 13:
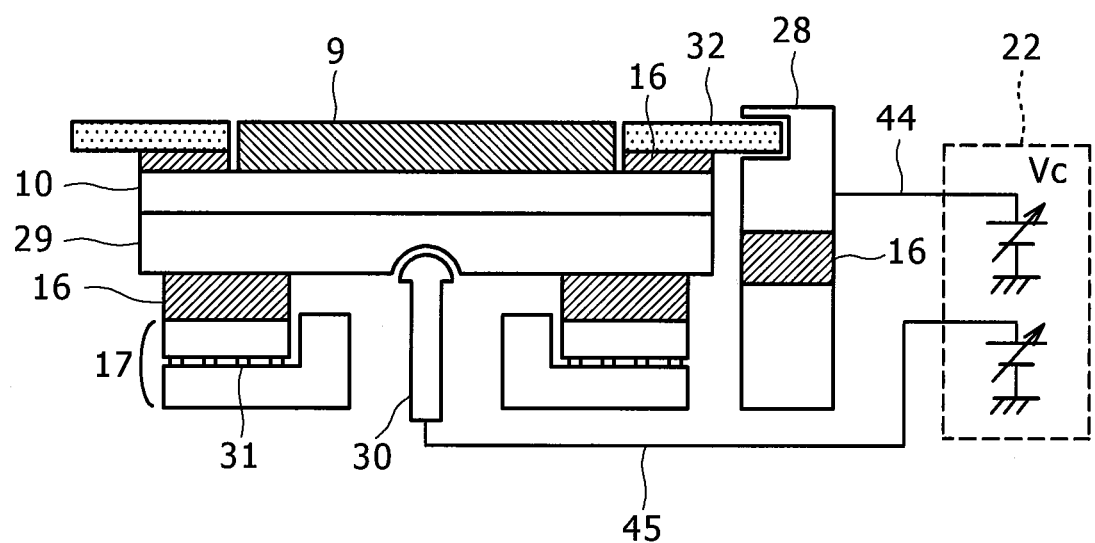
FIG. 13 is a sectional view showing roughly structures of a stage mechanism and an electric field control mechanism according to a third embodiment of the present invention.

Next, an inspection device that is according to a third embodiment of the present invention will be explained, referring to FIG. 13 to FIG. 15. First, FIG. 13 is a sectional view of the sample stage and its vicinity of a charged particle beam device according to the third embodiment. It is of the same composition as that of the first embodiment except for the stage mechanical system and the voltage application mechanical system, and the view is drawn omitting the X-stage 18 and some higher-numbered constituents. An electric field control plate 32 isolated by the insulator 16 is provided in the peripheral part of the sample 9 on the sample holder 10. Furthermore, the electric field control electrode 28 is provided on the X-stage 18 in the vicinity of the electric field control plate 32. To the sample 9 and the sample holder 10, the retarding voltage is applied from the power supply unit 22 through the holder receiver 29. To the electric field control electrode 28, a predetermined applied voltage $V_c$ is supplied from the power supply unit 22. The electric field control plate 32 and the electric field control electrode 28 are provided in very close proximity to each pother. However, since they do not contact with each other, when the electric field control plate 32 rotates, dusts by its friction with the electric field control electrode 28 and the like do not occur.

Figure 14:
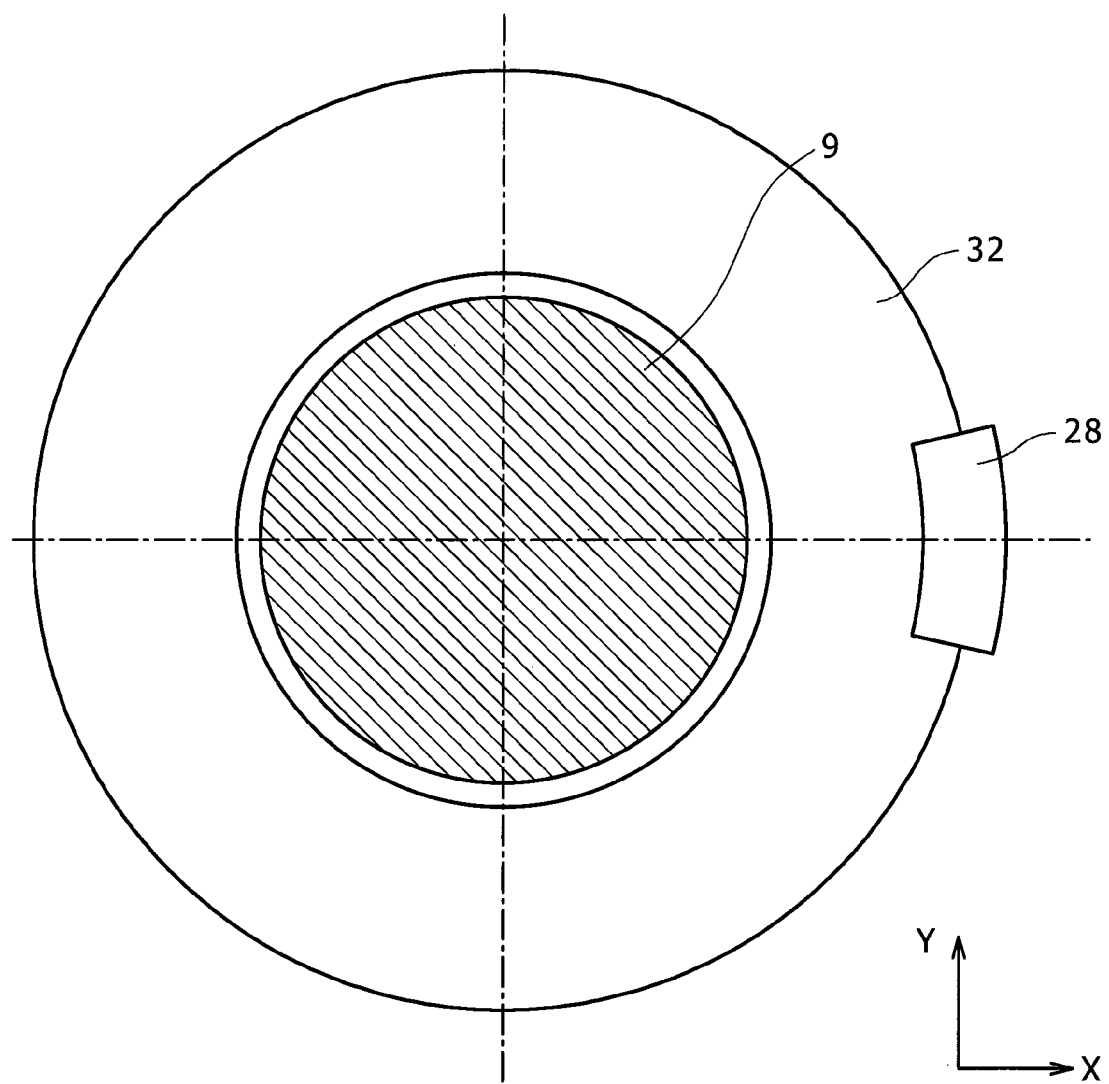
FIG. 14 is a plan view showing roughly structures of the stage mechanism and the electric field control mechanism of the third embodiment.

FIG. 14 is a diagram of the electric field control portion when seeing it from above. The electric field control plate 32 is provided over the whole periphery of the sample 9. Moreover, the electric field control electrode 28 is provided so as to cover a part of the electric field control plate 32 (near its periphery) for about 10 mm in the circumferential direction or for a slightly longer range than that.

Figure 15:
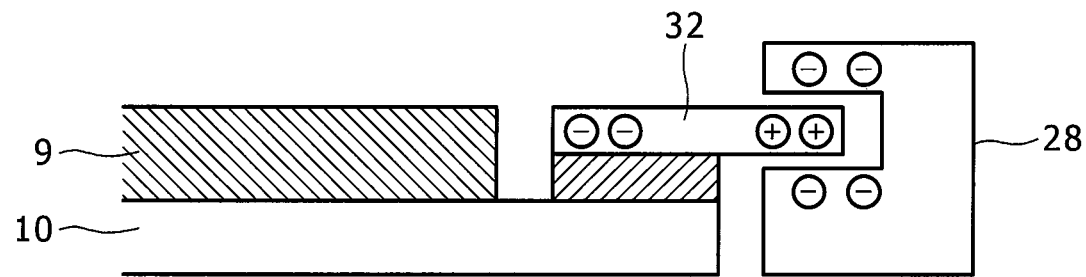
FIG. 15 is a diagram showing roughly a situation of electric charges at the sample edge of the third embodiment.

FIG. 15 schematically shows a situation of the electric charges at the sample edge. When a negative voltage is applied to the electric field control electrode 28, negative charges accumulate in the electric field control electrode 28. On the other hand, positive charges induced by the negative charges in the electric field control electrode 28 accumulate in the vicinity of the electric field control electrode 28 of the electric field control plate 32, and negative charges accumulate in portions other than it. With the negative electric charges accumulated in the vicinity of the sample 9 in the electric field control plate 32, it is possible to vary the equipotential plane and to bring the equipotential plane on the sample 9 close to horizontality.

What is necessary regarding a method of adjusting the optimal applied voltage to the electric field control electrode 28 with respect to an arbitrary rotation angle $\theta_x$ of the θ-stage 17 is just to adjust it using the data of the look-up table 250 obtained in the flow shown in FIG. 6. The observation and inspection of the sample 9 performed by the inspection part 241 of the device control unit 24 are implemented by a processing flow as shown in FIG. 9 and FIG. 11.

According to this embodiment, by adjusting the voltage applied to the electric field control electrode, it is possible to vary the equipotential plane on the sample and thereby to suppress the electric field distortion at the sample edge. Although the installation of the electric field control plate makes the configuration of the electric field control electrode somewhat complex, an electromagnetic distance between the sample edge and the electric field control electrode becomes shorter, so that it becomes possible to shorten a time until a state reaches to a state of FIG. 4D, compared to the first and second embodiments. Moreover, by applying the retarding voltage applied to the sample from the rotation center, the rotary stage can perform the unlimited rotation. Therefore, the rotation direction of the rotary stage is not restricted, and consequently, the rotary stage can be moved to an arbitrary observation place promptly; thereby, it is possible to shorten the observation time.

Fourth Embodiment

Figure 16:
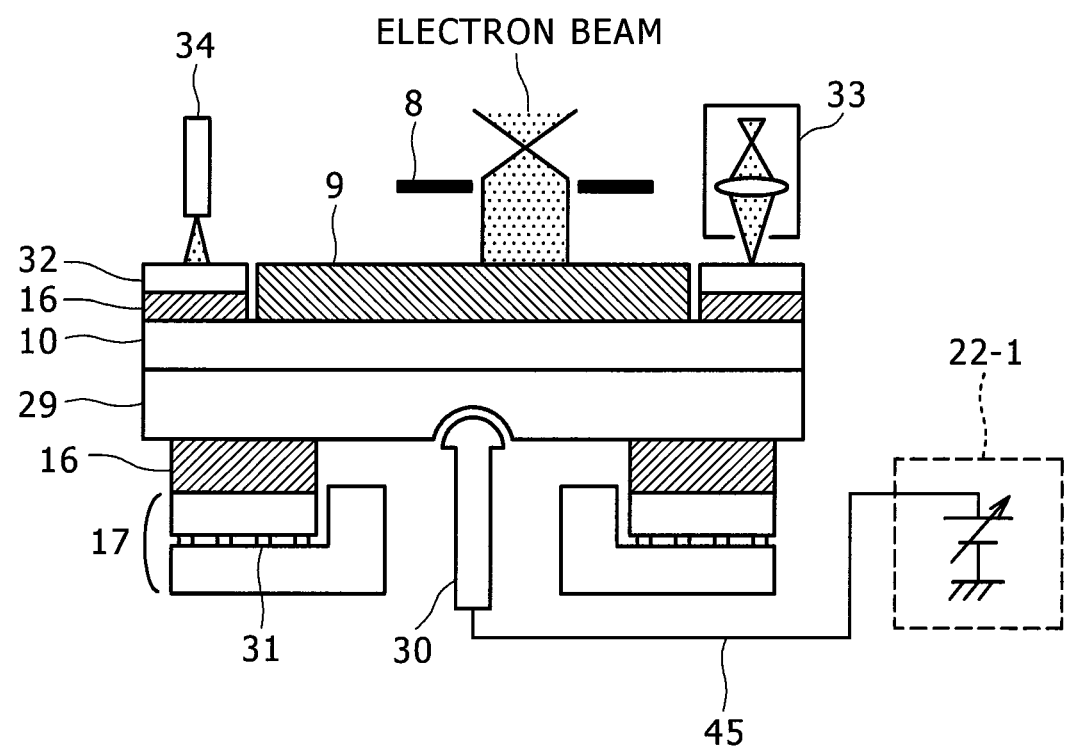
FIG. 16 is a sectional view showing roughly structures of a stage mechanism and an electric field control mechanism according to a fourth embodiment of the present invention.
Figure 17:
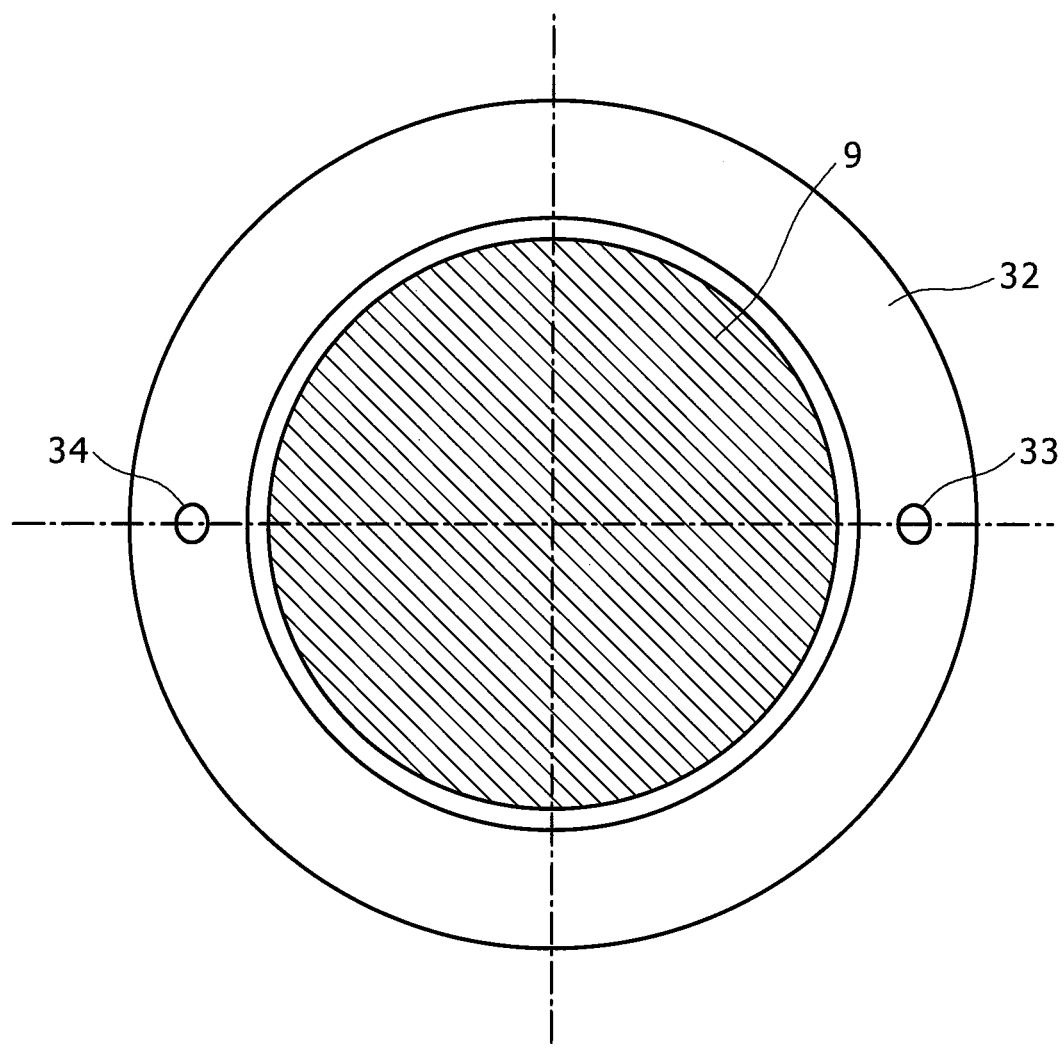
FIG. 17 is a plan view showing roughly the structures of the stage mechanism and the electric field control mechanism of the fourth embodiment.

Next, an inspection device according to a fourth embodiment of the present invention will be explained, referring to FIG. 16 and FIG. 17. First, FIG. 16 is a sectional view of the sample stage and its vicinity of the charged particle beam device according to the fourth embodiment; FIG. 17 is a view of the sample stage and its vicinity of FIG. 16 when seeing them from above. The device is the same as the first embodiment except for the stage mechanical system, the voltage application mechanical system, and a charge control electron gun 33 and an ultraviolet light source 34 that are added, and the view is drawn omitting the X-stage 18 and some higher-numbered constituents.

On the sample holder 10, the insulator 16 and the electric field control plate 32 are provided so as to surround the sample 9 over all portions of its periphery. The charge control electron gun 33 and the ultraviolet light source 34 are installed in positions where they can irradiate the electric field control plate 32. To the sample 9 and the sample holder 10, the retarding voltage is applied from the power supply unit 22-1 through the holder receiver 29.

Also in the stage mechanism of this embodiment, the θ-stage 17 and constituents above the θ-stage 17 have a function of relatively rotating the X-stage 18. Unlike the first to third embodiments, the electric field control plate 32 is provided on the θ-stage 17, and the electric field control plate 32 also rotates at the time of rotation of the sample by the θ-stage 17.

Instead of receiving a supply of the voltage from the power supply unit 22 through the wiring like the first to third embodiments, the electric field control plate 32 controls the equipotential plane using a wireless system, i.e., other power supply, the charge control electron gun 33, and the ultraviolet light source.

In this embodiment, when the electron beam emitted from the charge control electron gun 33 collides against the electric field control plate 32, electrons are accumulated in the electric field control plate 32. Then, the equipotential plane on the electric field control plate 32 rises by the negative charges in the electric field control plate 32. As the equipotential plane rises, the equipotential plane on the sample 9 also rises and a range of the horizontal equipotential plane on the sample 9 expands. On the other hand, in the case where the electrons accumulated in the electric field control plate 32 are intended to be removed to lower the equipotential plane, ultraviolet rays emitted from the ultraviolet light source 34 are irradiated to the electric field control plate 32. Electrons are emitted from the electric field control plate 32 by a photoelectric effect by the ultraviolet rays, and the electrons accumulated in the electric field control plate 32 decrease in number. By using the charge control electron gun 33 and the ultraviolet light source 34, it is possible to control the amount of charges in the electric field control plate 32, and therefore possible to control the equipotential plane on the sample 9.

For example, denoting the retarding voltage supplied from the power supply unit 22-1 by VA, the amount of charge (voltage) of the electric field control plate 32 from the charge control electron gun 33 by V1(−), and the amount of removed charge (voltage) of the electric field control plate 32 from the ultraviolet light source 34 by V2(+), the applied voltage $V_c=V1+V2$ applied to the electric field control plate 32 is controlled to be a voltage including an adjustment value that depends on the rotation angle of the θ-stage 17 like the example shown in FIG. 7 of the first embodiment. The observation and inspection of the sample 9 performed by the inspection part 241 of the device control unit 24 is implemented by a processing flow as shown in FIG. 9 and FIG. 11.

According to this embodiment, by adjusting the voltage applied to the electric field control electrode, it is possible to vary the equipotential plane on the sample and thereby to suppress the electric field distortion at the sample edge. Although the installation of the electric field control plate on the rotary stage makes the configuration of the electric field control electrode slightly complex, an electromagnetic distance between the sample edge and the electric field control electrode becomes shorter and it is possible to shorten a time until a state reaches to the state of FIG. 4D compared with the first and second embodiments. Moreover, by applying the retarding voltage applied to the sample from the rotation center, the rotary stage can perform the unlimited rotation. Therefore, the rotation direction of the rotary stage is not restricted, and consequently, the rotary stage can be moved to an arbitrary observation place promptly; thereby, it is possible to shorten the observation time.

Incidentally, although the techniques of the first to fourth embodiments are shown taking a case of the projection system in which the irradiation electron beam to the sample is an area beam as an example, they are effective also in devices of a scanning electron beam system or using other charged particle beams, such as an ion beam.

What is claimed is:

1. A charged particle beam device, comprising;
an irradiation optical system for irradiating a charged particle beam to a sample to be observed;
an imaging optical system for imaging a charged particle beam emitted or reflected from the sample;
a power supply unit for applying a first DC voltage to the sample;
a base stage for moving the sample;
a rotary stage for rotating the sample on the base stage;
a sample holder disposed on the rotary stage for holding the sample, and
a sample electric field control electrode that is provided in the outer periphery of the rotary stage, being independent from the rotary stage, for varying an equipotential plane on the sample,
wherein, when the sample is held on the sample holder, a gap exists between the sample and the sample electric field control electrode mechanism,
wherein the sample electric field control electrode has applied thereto a second DC voltage from the power supply unit and is provided along the outer circumference of an edge of the sample, when the sample is held on the sample holder,
wherein the sample electric field control electrode applies the second DC voltage for varying the equipotential plane in accordance with the rotation of the rotary stage during imaging with the charged particle beam, and
wherein the sample electric field control electrode makes the equipotential plane on the sample horizontal as far as the edge of the sample by varying the equipotential plane at the gap,
the charged particle beam device further comprising:
an electric field control plate that surrounds the periphery of the sample and is disposed on the sample holder,
an insulator provided between the sample holder and the electric field control plate,
a charge control electron gun for charging the electric field control plate by irradiating an electron beam to the electric field control plate, and
an ultraviolet light source for neutralizing the electric field control plate by irradiating ultraviolet rays to the electric field control plate,
wherein the voltage of the electric field control plate is controlled by electron beam irradiation with the charge control electron gun and by ultraviolet ray irradiation with the ultraviolet light source.

2. The charged particle beam device according to claim 1, wherein the base stage has a linear stage for linearly moving the sample, and a Z-stage for varying a height position of the sample.

3. The charged particle beam device according to claim 1, wherein the rotary stage is a θ stage that is unlimitedly rotatable on the base stage.

4. The charged particle beam device according to claim 1, wherein the power supply unit for applying the first DC voltage to the sample has an electrode that is in contact with the rotary stage at a rotation center of the rotary stage.

5. The charged particle beam device according to claim 1, wherein the electric field control electrode is provided on a part of the periphery or over the whole of the periphery of the sample.

6. The charged particle beam device according to claim 1, further comprising;
a device control unit,
an image processing unit for processing an image obtained by the imaging optical system, and
a monitor that is connected to the image processing unit and has a GUI function,
wherein a display screen of the monitor includes; an image display part for displaying an observed image, and a stage-voltage operation part for operating a position of the rotary stage and an applied the second DC voltage to the sample electric field control electrode.

7. The charged particle beam device according to claim 6, wherein the image display part of the monitor displays a state of image shift of an acquired image when the base stage is moved.

8. The charged particle beam device according to claim 1, wherein the second DC voltage applied to the sample electric field control electrode is set according to the rotation angle of the rotary stage.

9. The charged particle beam device according to claim 1, further comprising:
a storage part for retaining a table storing the rotary stage rotation angle in correspondence with the second DC voltage applied by the sample electric field control electrode.

10. A charged particle beam device comprising;
an irradiation optical system for irradiating a charged particle beam to a sample to be observed;
an imaging optical system for imaging a charged particle beam emitted or reflected from the sample;
a base stage for moving the sample;
a rotary stage for rotating the sample on the base stage;
a sample holder disposed on the rotary stage for holding the sample, and
a power supply unit that has an electrode being in contact with the rotary stage at the rotation center of the rotary stage and applies a first DC voltage to the sample; and
a sample electric field control electrode that is provided in the outer periphery of the rotary stage, being independent from the rotary stage, for varying an equipotential plane on the sample,
wherein, when the sample is held on the sample holder, a gap exists between the sample and the sample electric field control electrode mechanism,
wherein the sample electric field control electrode has applied thereto a second DC voltage from the power supply unit and is provided along the outer circumference of an edge of the sample, when the sample is held on the sample holder,
wherein the sample electric field control electrode applies the second DC voltage for varying the equipotential plane in accordance with the rotation of the rotary stage during imaging with the charged particle beam, and
wherein the sample electric field control electrode makes the equipotential plane on the sample horizontal as far as the edge of the sample by varying the equipotential plane at the gap,
the charged particle beam device further comprising:
an electric field control plate that surrounds the periphery of the sample and is disposed on the sample holder,
an insulator provided between the sample holder and the electrical field control plate;
a charge control electron gun for charging the electric field control plate by irradiating an electron beam to the electric field control plate; and an ultraviolet light source for neutralizing the electric field control plate by irradiating ultraviolet rays to the electric field control plate;

wherein the second DC voltage of the electric field control plate is controlled by electron beam irradiation with the charge control electron gun and by ultraviolet ray irradiation with the ultraviolet light source.

11. The charged particle beam device according to claim 10, further comprising;

a linear stage for linearly moving the sample, and a θ-stage for rotating the sample on the linear stage, wherein the sample electric field control electrode is provided in the periphery of the θ-stage, and is supplied with a predetermined voltage through a first wiring from a power supply unit.

12. The charged particle beam device according to claim 10, further comprising a device control unit;

an image processing unit for processing an image obtained by the imaging optical system; and a storage device that retains data giving a relation between a discrete measured rotation angle of the rotary stage and a second DC voltage from the power supply unit to the sample electric field control electrode for each rotation angle of the sample;

wherein the sample electric field control electrode has applied thereto a second DC voltage from the power supply unit and adjusts the applied second DC voltage at the time of rotation of the sample; and wherein the device control unit obtains a setup voltage with respect to an arbitrary rotation angle of the rotary stage by performing an interpolation calculation from the data and controls the second DC voltage of the sample electric field control electrode.

13. The charged particle beam device according to claim 12, wherein the power supply unit applies the first DC voltage to the sample by an electrode making contact with the sample at the rotation center.

14. The charged particle beam device according to claim 12, wherein the sample surface is inspected on a plurality of concentric circles on the sample surface, by inspecting the sample while making one rotation of the rotary stage, and subsequently by repeating sequentially an operation of inspecting the sample while moving the irradiation position of the charged particle beam on the sample surface by ΔR in a radial direction, and further rotating the rotary stage in the same direction.

15. The charged particle beam device according to claim 12, wherein the inspection of the sample surface is performed along one strand of a spiral curved line continuous on the sample surface, by performing the inspection of the sample continuously while rotating the rotary stage in one direction and at the same time moving an irradiation position of the charged particle beam by an amount ΔR in a radial direction.

* * * * *